(12) United States Patent
Wenski et al.

(10) Patent No.: US 6,530,826 B2
(45) Date of Patent: Mar. 11, 2003

(54) PROCESS FOR THE SURFACE POLISHING OF SILICON WAFERS

(75) Inventors: Guido Wenski, Burghausen (DE); Thomas Buschhardt, Burghausen (DE); Heinrich Hennhöfer, Wohnsitz (DE); Bruno Lichtenegger, Wohnsitz (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 10/021,515

(22) Filed: Oct. 30, 2001

(65) Prior Publication Data

US 2002/0077039 A1 Jun. 20, 2002

(30) Foreign Application Priority Data

Nov. 24, 2000 (DE) .......................... 100 58 305

(51) Int. Cl.$^7$ .................................. B24B 1/00
(52) U.S. Cl. .................. 451/41; 451/28; 451/36; 451/57; 451/63; 451/287; 451/288; 51/307; 51/308; 51/309; 438/689; 438/690; 438/691; 438/692; 438/693
(58) Field of Search .............. 451/28, 36, 41, 451/57, 63, 287, 288; 51/307, 308, 309; 438/689–693

(56) References Cited

U.S. PATENT DOCUMENTS

| | | | |
|---|---|---|---|
| 3,874,129 A | * | 4/1975 | Decker et al. ............... 451/44 |
| 4,973,563 A | | 11/1990 | Prigge et al. |
| 5,449,316 A | | 9/1995 | Strasbaugh |
| 5,605,488 A | | 2/1997 | Ohashi et al. |
| 5,788,560 A | | 8/1998 | Hashimoto et al. |
| 5,851,140 A | | 12/1998 | Barnes et al. |
| 5,885,334 A | | 3/1999 | Suzuki et al. |
| 5,893,755 A | | 4/1999 | Nakayoshi |
| 6,040,245 A | | 3/2000 | Sandhu et al. |
| 6,290,580 B1 | * | 9/2001 | Tanaka et al. ............... 451/44 |

FOREIGN PATENT DOCUMENTS

| | | |
|---|---|---|
| DE | 22 47 067 | 8/1979 |
| DE | 197 19 503 | 11/1998 |
| DE | 199 05 737 | 12/2000 |
| DE | 100 12 840 | 4/2001 |
| DE | 199 58 077 | 6/2001 |
| DE | 100 04 578 | 7/2001 |
| EP | 311 994 | 3/1995 |
| EP | 684634 | 11/1995 |
| EP | 0 684 634 | 11/1995 |

OTHER PUBLICATIONS

English Derwent Abstract AN 1997–436983 corresponding to DE 197 19503.

(List continued on next page.)

Primary Examiner—Joseph J. Hail, III
Assistant Examiner—Shantese McDonald
(74) Attorney, Agent, or Firm—Collard & Roe, P.C.

(57) ABSTRACT

A process for the surface polishing of a silicon wafer, includes the successive polishing of the silicon wafer on at least two different polishing plates covered with polishing cloth, with a continuous supply of alkaline polishing abrasive with $SiO_2$ constituents, an amount of silicon removed during the polishing on a first polishing plate being significantly higher than on a second polishing plate, with the overall amount of silicon removed not exceeding 1.5 μm. A polishing abrasive (1a), then a mixture of a polishing abrasive (1b) and at least one alcohol, and finally ultrapure water (1c) are added to the first polishing plate, and a mixture of a polishing abrasive (2a) and at least one alcohol and then ultrapure water (2b) are added to the second plate.

11 Claims, 2 Drawing Sheets

OTHER PUBLICATIONS

English Derwent Abstract AN 1974–27334V corresponding to DE 22 47067.
English Derwent Abstract AN 2000–579981 corresponding to DE 199 05 737.
English Derwent Abstract AN 1989–116107 corresponding to EP 311 994.
English Derwent Abstract AN 2001–301080 corresponding to DE 100 12 840.
English Derwent Abstract AN 2001–409883 corresponding to DE 100 04 578.
English Derwent Abstract AN 2001–490114 corresponding to DE 199 58 077.

* cited by examiner

PROCESS FOR THE SURFACE POLISHING OF SILICON WAFERS

BACKGROUND OF THE INVENTION

1. Field of the Invention

The present invention relates to a process for producing a silicon wafer with a back surface and a front surface which has been polished until it is free of haze. This wafer is suitable for use in the semiconductor industry, in particular for the fabrication of electronic components following the application of an epitaxial coating.

2. The Prior Art

According to the prior art, silicon wafers for use in the semiconductor industry are produced by sawing up a silicon single crystal, followed by edge rounding, lapping or grinding, wet-chemical etching, polishing and cleaning The polishing has two essential roles. The first is that of producing the ultimate planarity which is required in order to avoid focusing problems for the stepper during component fabrication, firstly, and a low-defect surface. The second, on which—if appropriate after the application of an epitaxial coating—the failure of semiconductor components caused by electric short circuits is minimized. To fulfil these roles, the polishing of silicon wafers is generally carried out in two different, successive process steps. The first process step is known as stock-removal polishing which involves the removal of approximately 10 to 20 $\mu$m of silicon from the polished surface, establishing the planarity. The second process step is known as surface polishing (haze-free polishing), with at most 1.5 $\mu$m of silicon being removed, in order to produce a low-defect surface while as far as possible maintaining the planarity which has previously been established.

Single-side and double-side polishing processes are used for the stock-removal polishing. In the case of single-side polishing, by way of example after the wet-chemical etching process step, only one side of the silicon wafer, which is attached to a support device, generally the front surface to which components are subsequently to be applied, undergoes stock-removal polishing in the presence of a polishing cloth and with an alkaline polishing abrasive which contains abrasive substances being supplied. A process of this type, in which two different polishing abrasives are supplied in succession, is described in EP 684 634 A2. A two-stage process which is described in U.S. Pat. No. 5,885,334 operates with the supply of a polishing abrasive containing abrasive substances followed by the supply of an alkaline polishing abrasive which contains water glass. In the case of double-side polishing, the silicon wafers, which are held on their path by carriers, are moved freely between two polishing plates covered with polishing cloth while polishing abrasive is supplied. In this manner the silicon wafers are simultaneously polished on the front surface and on the rear surface. A process of this type is known, for example, from DE 199 05 737 C2.

Low defect rates on one side of the silicon wafer, generally the front surface on which it is intended for components to be fabricated, are achieved, according to the prior art, by single-side surface polishing. In this single-side surface polishing, a suitable combination of polishing abrasive and polishing cloth usually leads to significantly lower material removal rates than stock-removal polishing processes. The operation of surface polishing of silicon wafers is not dissimilar to CMP polishing (chemical mechanical planarization) of semiconductor wafers which are covered with precursors of semiconductor components, during which operation surface films are abraded or planarized. A CMP process, for example for polishing tungsten films, in which two different alkaline polishing abrasives are supplied in succession, is described in U.S. Pat. No. 6,040,245.

Modified CMP processes are known for the surface polishing of silicon wafers. For example, it is proposed in DE 22 47 067 B2 to have surface polishing with a polishing abrasive which contains $SiO_2$ as the abrasive substance and polyvinyl alcohol as surface-active substance to be carried out after stock-removal polishing. EP 311 994 B1 likewise describes a process which can be carried out on only one polishing plate and is based on the addition firstly of an alkaline polishing abrasive and then of an acidic polishing abrasive. The second solution may contain polar and/or surface-active components.

On installations for the surface polishing of semiconductor wafers which are currently commercially available—one example is disclosed in DE 197 19 503 A1 it is possible to carry out surface polishing processes by supplying two different polishing abrasives according to the prior art on two or more than two different polishing plates. For example, in operating practice, it is customary for silicon wafers, after the stock-removal polishing, during the surface polishing initially to be polished with polishing abrasive A on a plate 1 covered with polishing cloth. Then these silicon wafers are rinsed with ultrapure water, and immediately afterward are polished with polishing abrasive B on a plate 2 which is covered with polishing cloth. Then these silicon wafers are rinsed again with ultrapure water and the wafers are fed for cleaning and characterization. The process sequence is generally selected in such a way that predominantly a removal of silicon layers which are close to the surface takes place on plate 1, while on plate 2 the surface is smoothed, with the overall amount of material removed not exceeding 1.5 $\mu$m.

According to the prior art, it is possible for silicon wafers which have been surface-polished in this manner, after cleaning and drying, to be coated with a layer of the same crystal orientation which is grown on in single-crystal form, for example likewise comprising silicon, known as an epitaxial or epitaxially grown layer, to which semiconductor components are subsequently applied. The epitaxial coating leads to certain advantages which are known to the person skilled in the art. For example this leads to elimination of what is known as the latch-up problem in bipolar CMOS circuits and the absence of a significant oxygen content, so that the risk of oxygen precipitates, which could potentially destroy the circuit, in component-relevant regions is ruled out. However, the surface-polishing processes according to the prior art lead to silicon wafers which, following an epitaxial coating, have a certain number of surface defects which cannot be cleaned off. For example stacking faults and other localized light scatterers, which are detected by laser measurement in the size range of, for example, over 0.12 $\mu$m and, on account of electric short circuits, can lead to failures during the component fabrication process.

SUMMARY OF THE INVENTION

Therefore, it is an object of the present invention to provide a process for the surface polishing of a silicon wafer which leads to a reduced number of surface defects after the application of an epitaxial coating to this silicon wafer and therefore to cost savings in the component fabrication process.

The above object is achieved according to the present invention by providing a process for the surface polishing of a silicon wafer, comprising the successive polishing of the silicon wafer on at least two different polishing plates covered with polishing cloth, with a continuous supply of alkaline polishing abrasive with $SiO_2$ constituents, an amount of silicon removed during polishing on a first polishing plate being significantly higher than on a second polishing plate, with the overall amount of silicon removed not exceeding 1.5 µm, wherein a polishing abrasive (1a), then a mixture of a polishing abrasive (1b) and at least one alcohol, and finally ultrapure water (1c) are added to the first polishing plate, and a mixture of a polishing abrasive (2a) and at least one alcohol and then ultrapure water (2b) are added to the second plate.

An essential feature of the invention is that the improved surface-polishing process has a mixture of polishing abrasive and alcohol being added to both polishing plates. This leads to a significant reduction in localized light scatterers, in particular of stacking faults, on an epitaxial coating applied to this surface, compared to processes according to the prior art. The present invention leads to higher yields and therefore lower costs during the fabrication of semiconductor components. This was unexpectedly surprising and impossible to predict.

The starting material for the process of the invention is a silicon wafer which has undergone stock-removal polishing at least on a front surface. The end product of the process of the invention is a silicon wafer which has undergone surface polishing on a front surface and, after epitaxial coating, forms a superior starting material for semiconductor component processes to silicon wafers which have been produced according to the prior art. This is on account of a significantly lower number of localized light scatterers, for the silicon wafer produced according to the present invention.

The process according to the invention can in principle be used to produce silicon wafers with a very wide range of diameters which are customary in the semiconductor art. It is particularly suitable for the production of single-crystal silicon wafers with diameters of from 150 mm to 450 mm and thicknesses of from 400 µm to 1000 µm. Silicon wafers which have been produced according to the invention can either be used directly as starting material for the fabrication of semiconductor components. Or after the application of layers such as back-surface seals or an epitaxial coating on the wafer front surface, for example with silicon, and/or after conditioning by a heat treatment, for example under a hydrogen or argon atmosphere, are supplied for their intended purpose. In addition to the production of wafers from a homogeneous material, the invention may, of course, also be used for the production of products of multilayer structure, such as SOI (silicon-on-insulator) wafers.

In principle, it is possible for a large number of silicon wafers, which have been sawn, for example, by an annular sawing or wire sawing process and of which the areas which are close to the surface, depending on the diameter and nature of the sawing process, to have a damaged crystal microstructure down to a depth in the range from 10 to 40 µm. These damaged silicon wafers can be subjected to the surface-polishing process according to the invention immediately after a stock-removal polishing has been carried out. However, it is sensible and therefore preferred for the sharply delimited and therefore mechanically highly sensitive wafer edges to be rounded with the aid of suitably profiled grinding wheels. Suitable grinding wheels comprise metal-bonded or synthetic resin-bonded diamonds.

To improve the geometry and partially remove damage, it is possible for the silicon wafers to be subjected to a mechanical abrasion step, such as lapping or grinding. This is done in order to reduce the amount of material which has to be removed in the stock-removal polishing step. Both processes are equally preferred. When carrying out a grinding process, it is particularly preferable for the two sides to be ground sequentially or simultaneously. To remove damage from the wafer surface and edge and to eliminate in particular metallic impurities, an etching step is preferred at this point. This etching step may particularly preferably be carried out as a wet-chemical treatment of the silicon wafer in an alkaline or acidic etching mixture, with tile removal of from 1 to 50 µm of silicon.

Then follows a stock-removal polishing step, which may be carried out either as a single-side stock-removal polishing of the front surface of the silicon wafer or as a double-side process involving simultaneous polishing or the front surface and the back surface of the silicon wafer. The stock-removal polishing process selected depends on the diameter and the demands imposed on the fully processed silicon wafer, for example whether an etched or polished back surface is desired or which geometric and nano-topographical demands are to be satisfied. Generally, silicon wafers with diameters of less than 200 mm undergo stock-removal polishing on one side, while with diameters of over 200 mm double-side polishing is preferred. Both processes are used for 200-mm wafers. It is preferable to use an adhesively bonded, commercially available polyurethane polishing cloth with a hardness of from 60 to 90 (Shore A). This cloth may contain reinforcing polyester fibers, with a continuous supply of a polishing abrasive comprising 1 to 10% by weight of $SiO_2$ in ultrapure water. This is adjusted to a pH in the range from 9 to 12 by adding alkali, for example $Na_2CO_3$, $K_2CO_3$, NaOH, KOH, $NH_4OH$ and tetramethylammonium hydroxide. The percent by weight of $SiO_2$ is based upon the total weight of the polishing abrasive.

A preferred starting material for the process according to the invention is a silicon wafer with a diameter of 150 mm or 200 mm. This wafer is produced by annular sawing of a silicon single crystal, followed by edge rounding, lapping involving the removal of a total of 20 µm to 150 µm of silicon, wet-chemical etching in an alkaline etching mixture, involving the removal of from 10 µm to 50 µm of silicon from each side of the wafer, and single-side stock-removal polishing, involving the removal of from 5 to 25 µm of silicon. A further preferred starting material for the process according to the invention is a silicon wafer with a diameter of greater than or equal to 200 mm, produced by wire sawing of a silicon single crystal. This is followed by edge rounding, sequential surface grinding of both sides of the wafer, with from 10 µm to 100 µm of silicon being removed from each side, wet-chemical etching in an acidic etching mixture, with from 1 µm to 40 µm of silicon being removed from each side of the wafer, and double-side polishing, with a total of from 5 µm to 50 µm of silicon being removed.

A commercially available surface-polishing machine with at least two polishing plates can be used to carry out the surface-polishing step according to the invention in order to produce a haze-free polished front surface. Either a single silicon wafer or a plurality of silicon wafers are simultaneously polished in one polishing operation; both procedures are equally preferred. To hold the silicon wafers during the surface polishing, wax-free processes, in which one or more silicon wafers are held by a rigid support plate covered with an elastic, porous film by the application of a vacuum and/or by water-assisted adhesion, are preferred in the context of the invention. Support devices of this type are described, for example, in U.S. Pat. No. 5,605,488 or U.S.

Pat. No. 5,893,755. The elastic film which is used for contact with the wafer back surface is preferably made from polymer foam, particularly preferably from polyurethanes. To improve the adhesion of the wafer which is to be polished, texturing with channels is possible, for example as described in U.S. Pat. No. 5,788,560. It is also particularly preferable, within the scope of the invention, to use a support device which, instead of the rigid support plate, has an elastic membrane, the use of which is described, for example, in U.S. Pat. No. 5,449,316 and U.S. Pat. No. 5,851,140. And if appropriate it is provided with a protective layer, for example an elastic film of polyurethane foam.

During the surface polishing of the front surface of the silicon wafer, an adhesively bonded, soft polishing cloth with a continuous supply of an aqueous, alkaline polishing abrasive based on $SiO_2$ is preferably used for polishing. In this case, a polishing abrasive (1a), then a mixture of a polishing abrasive (1b) and at least one alcohol, and finally ultrapure water (1c) are added to the first plate, and a mixture of a polishing abrasive (2a) and at least one alcohol, and then ultrapure water (2b) are added to the second polishing plate. If a polishing installation which has, for example, three plates is used, the surplus polishing plate is either not used or the formulation of the third polishing plate is matched to the two-plate process according to the invention. For example this can be done by running the sequence of the second plate according to the invention on the available second and third plates.

Preferably, the polishing abrasive (1a) substantially comprises a colloidal mixture of from 1 to 10% by weight of $SiO_2$ in water. It is particularly preferable to use a product which is based on precipitated silica as the $SiO_2$ fraction. To increase the silicon removal rate, a pH of between 10.5 and 12.0 is preferably established, by adding alkali, particularly preferably selected from the group of compounds consisting of $Na_2CO_3$, $K_2CO_3$, NaOH, KOH, $NH_4OH$ and tetramethylammonium hydroxide in proportions of from 0.01 to 10% by weight. The percent by weight of the $SiO_2$, and the percent by weight of the alkali, are each based upon the total weight of the polishing abrasive.

The polishing abrasives (1b) and (2a) preferably substantially comprise a colloidal mixture of from 0.1 to 5% by weight of $SiO_2$ in water with the addition of at least one alcohol and preferably have a pH of between 9.0 and 10.5. It is possible to use the same polishing abrasive/alcohol mixture for (1a) and (2b), although this is not imperative within the context of the invention.

Particularly suitable polishing abrasives (1b) and (2a) are aqueous suspensions which contain $SiO_2$ particles with a grain size of between 5 and 50 nm, the use of $SiO_2$ particles produced by pyrolysis of $Si(OH)_4$ ("pyrogenic silica") being particularly preferred. In certain cases, however, it may be appropriate for precipitated silica also to be used in these steps. Within the context of the invention, monohydric organic alcohols, i.e. those which have one OH group, or polyhydric organic alcohols, i.e. those which have two or more OH groups, in pure form or as a mixture, are suitable as the alcohol addition. The alcohol, through a condensation reaction with the hydrophobic silicon surface, which has Si-H terminal groups, leads to a reduction in the rate at which material is removed and therefore to a smoothing of the surface. This effect is enhanced the greater the number of OH groups in the alcohol. Therefore, the addition of one or various polyhydric alcohols in a proportion of from 0.01 to 10% by volume is particularly preferred. The percent by volume of the alcohol is based upon the total volume of the polishing abrasive.

In the process according to the invention, the amount of silicon removed should preferably not exceed 1.5 $\mu$m, and particularly preferably should not exceed 1 $\mu$m, in order, on the one hand, not to endanger any planarity criteria imposed on the wafer and, on the other hand, to keep the process costs as low as possible. The process sequence according to the invention—in particular carrying out the polishing step which uses the polishing abrasive (1a)—leads to significantly more silicon, preferably at least twice as much silicon, being removed on the first polishing plate than on the second polishing plate 2. The effect can advantageously also be promoted by using a slightly harder polishing cloth on the first polishing plate than on the second polishing plate. Consequently, the polishing on the first polishing plate preferably serves to remove defects and to smooth them. The polishing on the second polishing plate preferably serves to remove the haze and therefore to match the surface roughness to the requirements of the following processes.

Virtually all alcohols which can be mixed with the polishing abrasive in the desired concentration and are chemically stable may be suitable as the alcohol addition. One example is n-butanol. The polyhydric alcohol which is preferably used is preferably included in the list of compounds and compound classes consisting of glycerol (1,2,3-propanetriol), monomeric glycols, oligomeric glycols, polyglycols and polyalcohols. Examples of suitable monomeric glycols are ethylene glycol (1,2-ethanediol), propylene glycols (1,2- and 1,3-propanediol) and butylene glycols (1,3- and 1,4-butanediol). Examples of suitable oligomeric glycols are diethylene glycol, triethylene glycol, tetraethylene glycol and dipropylene glycol. Examples of polyglycols are polyethylene glycol, polypropylene glycol and mixed polyethers. Examples of polyalcohols are polyvinyl alcohols and polyether polyols. Said compounds are commercially available, often in different chain lengths in the case of polymers.

The alcohol addition preserves the surface of the silicon wafer after the polishing steps using the polishing abrasives (1b) and (2a) and prevents the formation of spots following the treatment with ultrapure water. Moreover, the alcohol makes it easier to maintain the rotational conditions of the polishing plates during the addition of ultrapure water (1c) and (2b). A following cleaning and drying of the silicon wafers according to the prior art, which may be carried out as batch or individual wafer processes, completely removes any alcohol residues which may be present.

If necessary, a heat treatment may be added at any desired point in the process sequence, for example in order to destroy thermal donors, to anneal a flaw in crystal layers close to the surface or to bring about controlled dopant depletion in the latter layers. Furthermore, laser inscription for wafer identification and/or an edge-polishing step may be added at suitable points. A series of further process steps which are required for certain products, for example the application of back-surface coatings, can also be incorporated in the process sequence at the appropriate points using processes which are known to the person skilled in the art.

The silicon wafer can then be supplied for further processing by the application of an epitaxial coating, for example of silicon, or can be fed directly to component fabrication. Particularly in the case of the epitaxially coated wafer, laser-assisted instrument inspection can be used to establish very low numbers of defects, and consequently the process according to the invention is superior to the process according to the prior art.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

The comparative example and the example according to the invention described below have associated figures which explain the present invention without being limitative of the present invention in any manner thereof.

DETAILED DESCRIPTION OF PREFERRED EMBODIMENT

Figure 1:
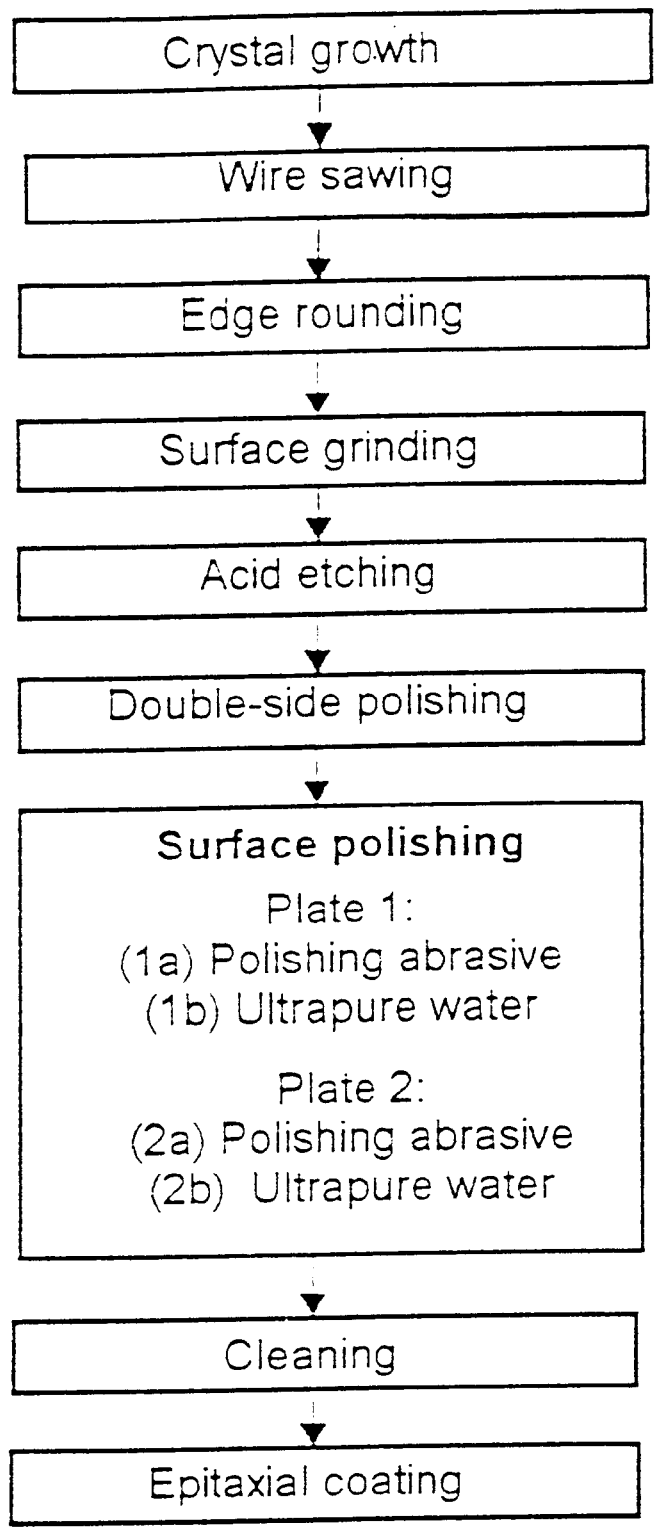
FIG. 1 shows the process sequence involved in the production of a silicon wafer with a back surface which has undergone stock-removal polishing and a surface-polished and epitaxially coated front surface in accordance with a Comparative Example of the prior art.
Figure 2:
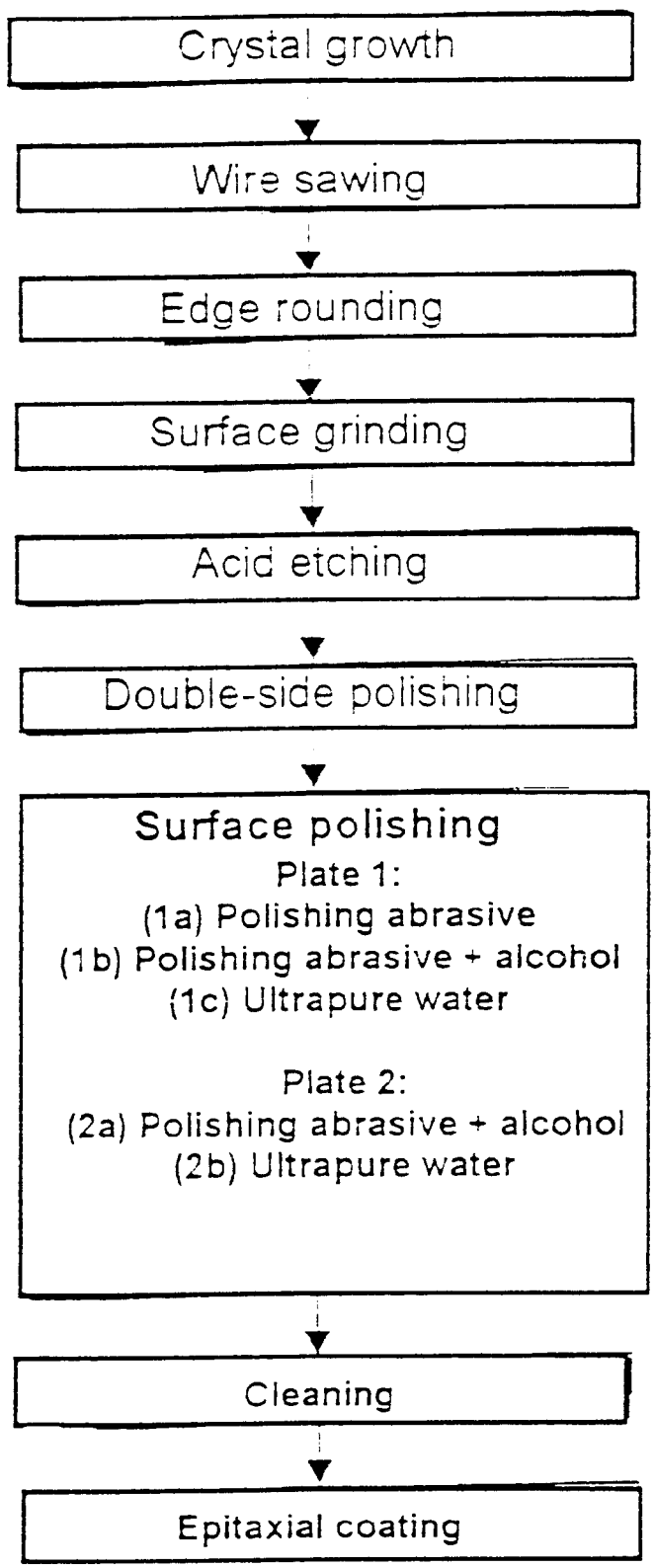
FIG. 2 shows the process sequence involved in the production of a silicon wafer with a back surface which has undergone stock-removal polishing and a surface-polished and epitaxially coated front surface in accordance with an Example of the present invention.

The Comparative Example and Example (Invention) relate to the production of silicon wafers with a diameter of 300 mm and a boron doping, which leads to a resistance in the range from 5 to 10 mΩ.cm, and which have an epitaxial layer of silicon on the front surface with a boron doping, which leads to a resistance in the range from 1 to 10 Ω.cm. For this purpose, single crystals have been pulled, cut to length and cylindrically ground, and then cut into wafers on a wire saw. After rounding of the edge, in each case 40 μm of silicon were successively removed from the wafer front surface and the wafer back surface on a rotary grinding machine. This was followed by an acid etching step in a mixture of concentrated nitric acid and concentrated hydrofluoric acid, with in each case 10 μm of silicon being removed simultaneously from each side of the wafer.

In the double-side stock-removal polishing step, 15 of the 300-mm silicon wafers were simultaneously polisher on a commercially available double-side polishing machine, with a total of 30 μm of silicon being removed, between an upper polishing plate and a lower polishing plate. Each of the upper and the lower polishing plates was covered with a polishing cloth of type SUBA500® produced by Rodel. The double-sided polishing is carried out with the aid of five carriers made of stainless chromium steel, each of which had three cutouts lined with PVDF. A polishing abrasive of type LEVASIL 200® from Bayer AG, was supplied with an $SiO_2$ solid content of 3% by weight and a pH which had been set at 11. After adhering polishing abrasive had been cleaned oft and drying had taken place, the wafers were transferred for surface polishing of the front surface. A commercially available surface-polishing installation with two separate, rotatable polishing plates and rotating support devices for silicon wafers with a diameter of 300 mm was available for this purpose. The installation had channels for picking up a semiconductor wafer by suction through the application of a vacuum and channels for ejecting the silicon wafer by means of positive pressure. It was substantially composed of a rigid support plate, to which an elastic polyurethane film was adhesively bonded, and a lateral delimiting ring, which was likewise attached thereto.

COMPARATIVE EXAMPLE

On plate 1, polishing was carried out for 150 sec using a POLYTEX® polishing cloth produced by Rodel with the addition of the polishing abrasive LEVASIL 300® (3% by weight of $SiO_2$ in ultrapure water; pH set at 10.5 by the addition of $K_2CO_3$). Then, while rotation of the polishing plate and spindle continued, ultrapure water was supplied for 30 sec. Plate 2 was covered with an adhesively bonded polishing cloth of type NAPCON 4500 N2® produced by Nagase. To carry out the second, smoothing polishing step, the polishing abrasive GLANZOX 3900® (1% by weight of $SiO_2$ in ultrapure water; pH 9.8) was supplied for 120 sec, followed by a supply of ultrapure water for a period of 30 sec while rotation of polishing plate and spindle continued. The total amount of silicon removed from the front surface of the silicon wafer was on average 0.6 μm, of which approximately 0.5 μm was removed on polishing plate 1.

EXAMPLE (INVENTION)

The procedure utilized was analogous to that used in the Comparative Example. The following procedure was selected for the surface polishing, with the same polishing cloths being used. First of all, on plate 1, polishing was once again carried out with LEVASIL 300® (3% by weight of $SiO_2$; pH 10.5), this time for 120 sec. Then, a polishing abrasive which comprised an aqueous suspension of pyrogenic silica ($SiO_2$ particle size 30–40 nm; solid content 1.5% by weight; $NH_4OH$-stabilized), to which 0.2% by volume of triethylene glycol had been admixed and which had a pH of 9.7, was added for 40 sec. Then, ultrapure water was supplied for 20 sec. On plate 2, with an otherwise identical procedure to that utilized in the Comparative Example, the same suspension of pyrogenic silica with added triethylene glycol as on plate 1 was used. The total amount of silicon removed from the front surface of the silicon wafer was this time on average 0.5 μm, of which approximately 0.4 μm was removed on plate 1.

EPITAXIAL COATING AND CHARACTERIZATION

After cleaning in a bath installation and drying, the silicon wafers from the Comparative Example and the Example (Invention) were epitaxially coated with 2.0 μm of silicon on the surface-polished front surface in an epitaxy reactor of type CENTURA HT308® produced by Applied Materials. The reactor chamber temperature was 1100° C. and the deposition rate was 3 μm/min, the silicon component used being $SiHCl_3$ and the resistance being set by doping with diborane, $B_2H_6$.

The front surface of in each case 150 of the epitaxially coated silicon wafers from the Comparative Example and the Example (Invention) were characterized with regard to the number of defects on the epitaxially coated front surface. This was done on a surface inspection appliance which operates using the laser principle, of type SP1® produced by KLA-Tencor. The overall number of localized light scatterers of greater than or equal to 0.12 μm in the DCN ("dark field composite") channel revealed an average of 101±19 (Comparative Example) and 12±4 (Example Invention). An examination of the defects under an optical microscope revealed that in the case of the Comparative Example the defects were primarily stacking faults, while there were scarcely any stacking faults observed on the wafers of the Example (Invention).

Accordingly, while a few embodiments of the present invention have been shown and described, it is to be understood that many changes and modifications may be made thereunto without departing from the spirit and scope of the invention as defined in the appended claims.

What is claimed is:

1. A process for the surface polishing of a silicon wafer, comprising successive surface polishing of a silicon wafer on at least two different polishing plates with each polishing plate being covered with a polishing cloth;

removing an amount of silicon during the surface polishing on a first polishing plate, the amount being significantly higher than an amount of silicon removed during the surface polishing on a second polishing plate, with the overall amount of silicon removed not exceeding 1.5 μm;

continuously supplying alkaline polishing abrasive with $SiO_2$ constituents to each polishing plate during the surface polishing of the silicon wafer by adding to the first polishing plate a polishing abrasive (1a), then a mixture of a polishing abrasive (1b) and at least one alcohol, and finally ultrapure water (1c), and by adding to the second polishing plate a mixture of a polishing abrasive (2a) and at least one alcohol and then ultrapure water (2b).

2. The process as claimed in claim 1, further comprising stock-removal polishing of a surface of the silicon wafer before said surface polishing of the silicon wafer; and wherein the surface polishing is carried out on said surface of the silicon wafer which has undergone said stock-removal polishing, between 5 μm and 25 μm of silicon being removed during the stock-removal on this surface.

3. The process as claimed in claim 1, wherein the polishing abrasive used for the surface polishing has an $SiO_2$ content of between 0.1 and 10% by weight and a pH of between 9 and 12; and the percent by weight of $SiO_2$ content is based upon a total weight of the polishing abrasive.

4. The process as claimed in claim 1, wherein the polishing abrasive (1a) has a higher pH than the polishing abrasive (1b).

5. The process as claimed in claim 1, wherein the polishing abrasives (1b) and (2a) are identical and are different from the polishing abrasive (1a).

6. The process as claimed in claim 1, wherein the polishing abrasive (1a) substantially comprises a colloidal mixture of from 1 to 10% by weight of $SiO_2$ in water with the addition of alkali and has a pH of from 10.5 to 12.0;

the polishing abrasives (1b) and (2a) substantially comprise a colloidal mixture of from 0.1 to 5% by weight of $SiO_2$ in water with the addition of at least one alcohol and have a pH of from 9.0 to 10.5; and the percent by weight of the $SiO_2$ is based upon a total weight of the polishing abrasive.

7. The process as claimed in claim 6, wherein the alkali added to the polishing abrasive (1a) comprises a compound selected from a group consisting of $Na_2CO_3$, $K_2CO_3$, NaOH, KOH, $NH_4OH$, tetramethylammonium hydroxide and mixtures thereof, in proportions of from 0.01 to 10% by weight; and the percent by weight of the alkali is based upon the total weight of the polishing abrasive.

8. The process as claimed in claim 1, wherein the polishing abrasive (1a) contains precipitated silica with a grain diameter of between 5 and 50 nm as the $SiO_2$ component; and the polishing abrasives (1b) and (2a) contain pyrogenic silica with a grain diameter of between 5 and 50 nm as the $SiO_2$ component.

9. The process as claimed in claim 1, wherein the polishing abrasives (1b) and (2a) contain at least one polyhydric alcohol selected from a group consisting of glycerol, a monomeric glycol, an oligomeric glycol, a polyglycols and a polyalcohol, which is used in proportions of from 0.01 to 10% by volume; and said percent by volume of alcohol is based upon a total volume of the polishing abrasive.

10. The process as claimed in claim 1, wherein the polishing cloth used on the second polishing plate is softer than the polishing cloth used on the first polishing plate.

11. The process as claimed in claim 1, wherein after the surface polishing, cleaning and drying of the silicon wafer is carried out followed by applying an epitaxial coating to the silicon wafer.

* * * * *